United States Patent [19]
Wang

[11] Patent Number: 5,847,601
[45] Date of Patent: Dec. 8, 1998

[54] SWITCHED CAPACITOR COMMON MODE FEEDBACK CIRCUIT FOR DIFFERENTIAL OPERATIONAL AMPLIFIER AND METHOD

[75] Inventor: Binan Wang, Tucson, Ariz.

[73] Assignee: Burr-Brown Corporation, Tucson, Ariz.

[21] Appl. No.: 835,892

[22] Filed: Apr. 8, 1997

[51] Int. Cl.[6] .............................. H03F 1/02; H03F 3/45
[52] U.S. Cl. ................................. 330/9; 330/258
[58] Field of Search .............................. 330/9, 252, 253, 330/258, 259

[56] References Cited

U.S. PATENT DOCUMENTS

| | | | |
|---|---|---|---|
| 4,794,349 | 12/1988 | Senderowicz et al. | 330/258 X |
| 4,820,998 | 4/1989 | Roessler et al. | 330/258 |
| 4,906,943 | 3/1990 | Koch | 330/258 |
| 5,691,720 | 11/1997 | Wang et al. | 341/143 |

OTHER PUBLICATIONS

"A High–Performance Micropower Switched–Capacitor Filter", by Rinaldo Castello and Paul R. Gray, IEEE J. Solid–State Circuits, vol. SC–20, No. 6, pp. 1122–1132, Dec. 1985.

*Primary Examiner*—Steven Mottola
*Attorney, Agent, or Firm*—Cahill, Sutton & Thomas P.L.C.

[57] ABSTRACT

An operational amplifier circuit includes a differential operational amplifier and a common mode feedback circuit with first and second transistors (16 and 20) having source electrodes connected to first and second supply voltage conductors and drains coupled to first and second outputs of the operational amplifier, respectively. First and second capacitors (24 and 25) are connected in series between gate electrodes of the first and second transistors and have a common point connected to the first output. A first switch capacitor circuit periodically refreshes the first capacitor to a voltage equal to the average of the first and second supply conductor voltages minus first and second predetermined bias voltages, respectively. A second similar common mode feedback circuit is coupled to the second output a differential output voltage produced by the operational amplifier results in equal excursions of the first and second outputs on opposite sides of the common mode feedback signal.

9 Claims, 5 Drawing Sheets

SWITCHED CAPACITOR COMMON MODE FEEDBACK CIRCUIT FOR DIFFERENTIAL OPERATIONAL AMPLIFIER AND METHOD

BACKGROUND OF THE INVENTION

The invention relates to a common mode feedback circuit connected to provide a stable common mode output voltage at the differential outputs of an amplifier, and more particularly to such a common mode feedback circuit which does not require an external reference voltage from which the common mode output voltage is generated.

If a differential output amplifier only has differential feedback of the output to the differential input, but does not have a common mode feedback (CMFB circuit), the common mode output voltage will drift toward the upper power supply voltage or the lower power supply voltage. Therefore, a CMFB circuit is required to stabilize the common mode output voltage to a desired level. Typically, a CMFB circuit is designed to establish a stable common mode output voltage approximately half way between the positive and negative or ground power supply voltages.

Fully differential operational amplifiers with common mode feedback circuits are disclosed in the paper by Costello and Gray "A High-Performance Micropower Switched-Capacitor Filter", IEEE Journal of Solid-State Circuits, vol. SC-20, no. 6, pp. 1122–1132, December 1985, and in U.S. Pat. No. 4,906,943 (Koch). The Costello and Gray paper discloses a common mode feedback circuit, reproduced herein as prior art FIG. 5, which has two pairs of series-connected complementary (N-channel and P-channel) operating point transistors connected to and disposed symmetrically with respect to each output terminal of the differential operational amplifier. These transistors are coupled between the supply voltage conductors. The P-channel operating point transistors M4 and M5 are controlled with the aid of a current mirror from a current source. The drain electrodes of the two pairs of operating point transistors are connected to the output terminals, respectively, of the differential operational amplifier (main amplifier) and also to circuitry that generates the desired CMFB voltage. A capacitor ($C_1$ or $C_2$) is provided between each output terminal of the differential operational amplifier and the gate electrode of the respective N-channel operating point transistor, in order to generate a common mode feedback path for the common mode output signal. Using switched capacitor technology, one terminal of each of these capacitors (C1 and C2 of prior art FIG. 5) is coupled to and uncoupled from an external voltage source terminal ($V_{CMO}$) supplying the desired common mode voltage. The other terminals of each of these capacitors also are coupled to and uncoupled from a bias circuit which establishes desired bias voltages for the gates of the operating point transistors. The known CMFB circuit is capable of rapid slewing of positive common mode voltage changes, because in that case the N-channel operating point transistors become increasingly conductive in proportion to the positive common mode signal. However, the speed for recovery of negative common mode glitches or transitions is limited by the constant currents supplied by the P-channel operating point transistors M4 and M5 which function as constant current sources.

Figure 4:
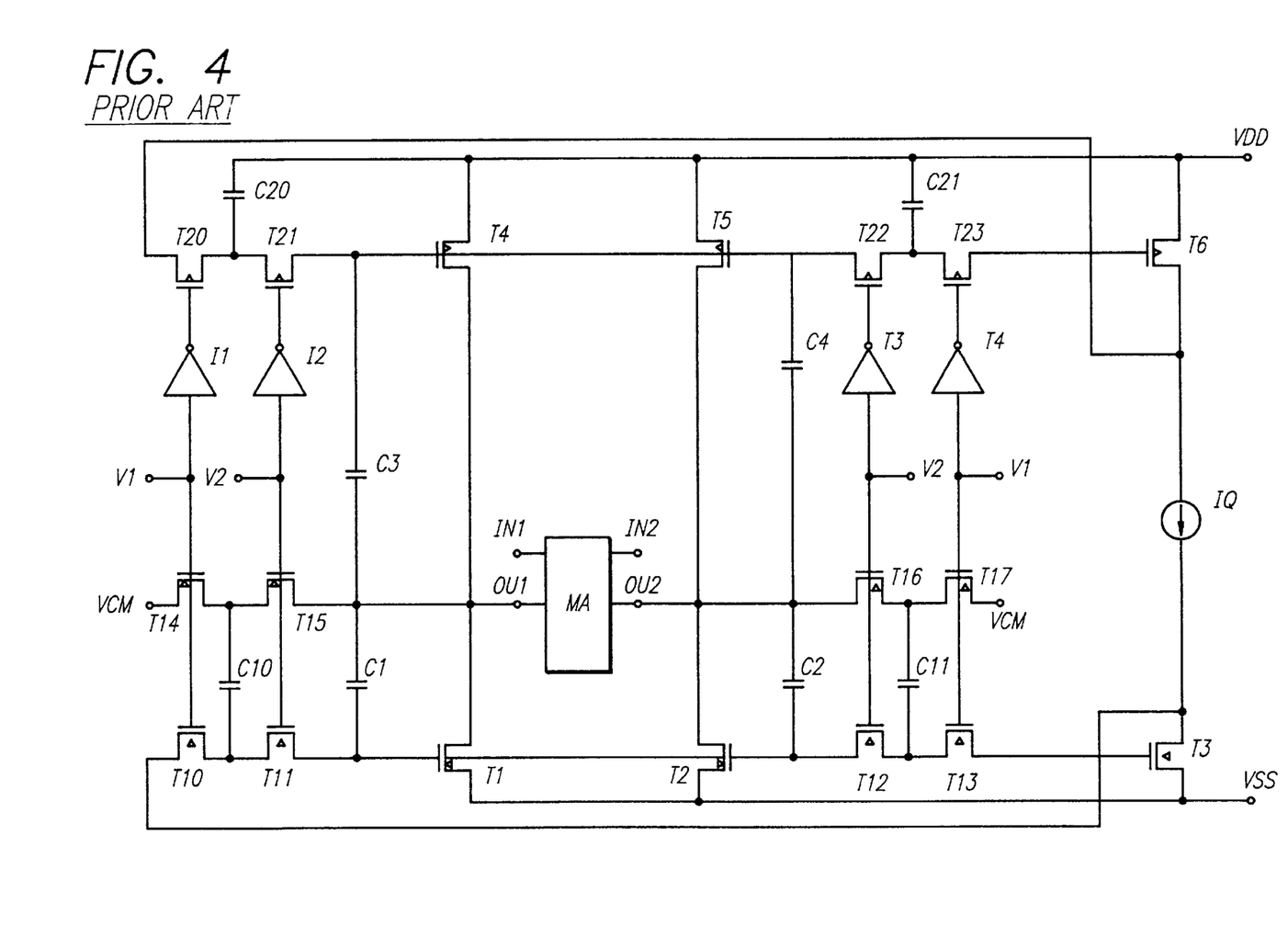
FIG. 4 is a schematic diagram of the closest prior art.

The common mode feedback circuit of U.S. Pat. No. 4,906,943 is reproduced in prior art FIG. 4 hereof, which is believed to constitute the closest prior art. In the '943 patent, the CMFB includes all of the circuitry shown in prior art FIG. 4 except the details of a fully differential operational amplifier in the block labeled MA. The portion of the circuitry including N-channel transistors T1, T2, T10, T11, T12, and T13 is mirror imaged to provide the circuitry including P-channel MOSFETs T4, T5, T20, T21, T22, and T23, respectively, and capacitors C1 and C2 are "mirrored" to provide capacitors C3 and C4, respectively, in order to solve the stated problems with the CMFB circuit of the above-described Costello and Gray circuit. The common mode output voltage generated by the CMFB circuitry in prior art FIG. 4 is generated from an external "direct voltage operating point potential" VCM which is generated by an external circuit (not shown) by means of N-channel MOSFETS T14, T15, T16, and T17. The capacitors C20 and C21 are not mirror images of capacitors C10 and C11.

Referring again to the operation of the Costello and Gray circuit (prior art FIG. 5), the CMFB circuitry includes MOSFETs M1 and M2, the CMFB circuit includes two "refresh" branches so that when the circuit is powered up initially, $C_{1a}$ and $C_{2a}$ can completely charge capacitors C1 and C2 up to their desired voltages in a number of cycles of clock signals $\phi 1$ and $\phi 2$ and thereby set up the proper common mode output voltage for the differential amplifier to which the CMFB circuit is connected. The bias current I is set up to establish the proper levels of the gate voltage of MOSFETs M1 and M2. The external circuit producing the common mode voltage VCMO is sampled on one terminal of each of C1 and C2, and the gate voltage of M1 and M2 are sampled on the other terminals thereof.

A major problem with the Costello and Gray circuit is that although a positive-going "glitch" or transient on the output common mode voltage of the operational amplifier turns MOSFETs M1 and M2 on much harder, so that they sink enough current to effectively oppose the glitch, a negative-going glitch or transient turns MOSFETs M1 and M2 off, and the maximum current available to oppose the negative-going glitch or transient is determined by the constant current I through MOSFETs M4 and M5, and therefore greatly limits the recovery speed of negative going output common mode voltage transients of the operational amplifier.

The circuit of the '943 patent (prior art FIG. 4) overcomes this shortcoming by adding capacitors C3 and C4, which are mirror images of C1 and C2, so that negative-going common mode output voltage transients turn P-channel MOSFETs T4 and T5 (see prior art FIG. 4 hereof) on harder, proportionate to the amplitude of the negative going transient, and thereby much more effectively counter the negative going transient. However, the '943 circuit has the shortcoming that an external voltage source is required for generating the direct voltage operating point potential VCM, and also suffers from the shortcoming that the common mode output voltage generated thereby does not track accurately with variations in the positive power supply $V_{DD}$ or the power supply voltage $V_{ss}$.

Accordingly, there is an unmet need for a CMFB circuit for differential operational amplifier which does not require a separate reference voltage or circuit generating such reference voltage, and which provides a common mode output voltage that tracks variations in both the ground and positive power supply voltage levels, thereby achieving a larger dynamic range.

SUMMARY OF THE INVENTION

Accordingly, it is an object of the invention to provide an improved, lower cost CMFB circuit for a differential amplifier than is provided by the closest prior art.

It is another object of the invention to provide such a CMFB circuit which does not require an external voltage source to provide a reference voltage which is used to generate the common mode output voltage applied to the differential amplifier output.

It is another object of the invention to provide a CMFB circuit which tracks any variations in the positive power supply voltage and ground power supply voltage applied to the CMFB circuit and a differential operational amplifier receiving a common mode feedback voltage therefrom.

Briefly described, and in accordance with one embodiment thereof, the invention provides an operational amplifier circuit including a differential operational amplifier having first and second outputs, a first common mode feedback circuit, and a second common mode feedback circuit substantially identical to the first producing a second common mode voltage equal to the first on the second output (15) of the differential operational amplifier. The first common mode feedback circuit includes first (14) and second (15) common mode voltage control terminals coupled to the first and second outputs, respectively, a first operating point control transistor 16 having a source coupled to a first supply voltage conductor (GND) and a drain coupled to the first common mode voltage control terminal (14), and a second operating point control transistor 20 having a source coupled to a second supply voltage conductor ($V_{DD}$) and a drain coupled to the first common mode voltage control terminal (14), a first common mode feedback capacitor (24) having a first terminal coupled to a gate of the first operating point control transistor (16) and a second terminal coupled to the first common mode voltage control terminal (14) and a first terminal of a second common mode feedback capacitor (25) having a second terminal coupled to a gate of the second operating point control transistor (20), a first switched capacitor circuit including first (30) and second (31) sampling capacitors and first (26), second (27), third (28), and fourth (29) switches interconnected to sample a first reference voltage ($V_{34}$) and the voltage of the first and second supply voltages of the first and second supply voltage conductors by means of the first (30) and second (31) sampling capacitors and redistribute the sampled charge onto the first common mode feedback capacitor (24), and a second switched capacitor circuit including third (48) and fourth (49) sampling capacitors and fifth 40), sixth (41), seventh (52), and eighth (51) switches interconnected to sample a second reference voltage (56) and the voltages on the first and second supply voltage conductors by means of the third (48) and fourth (49) sampling capacitors and then redistribute the sampled charge onto the second common mode feedback capacitor (25), to thereby produce a common mode output voltage on the first output (14) of the differential operational amplifier.

DETAILED DESCRIPTION OF THE PREFERRED EMBODIMENT

Figure 1:
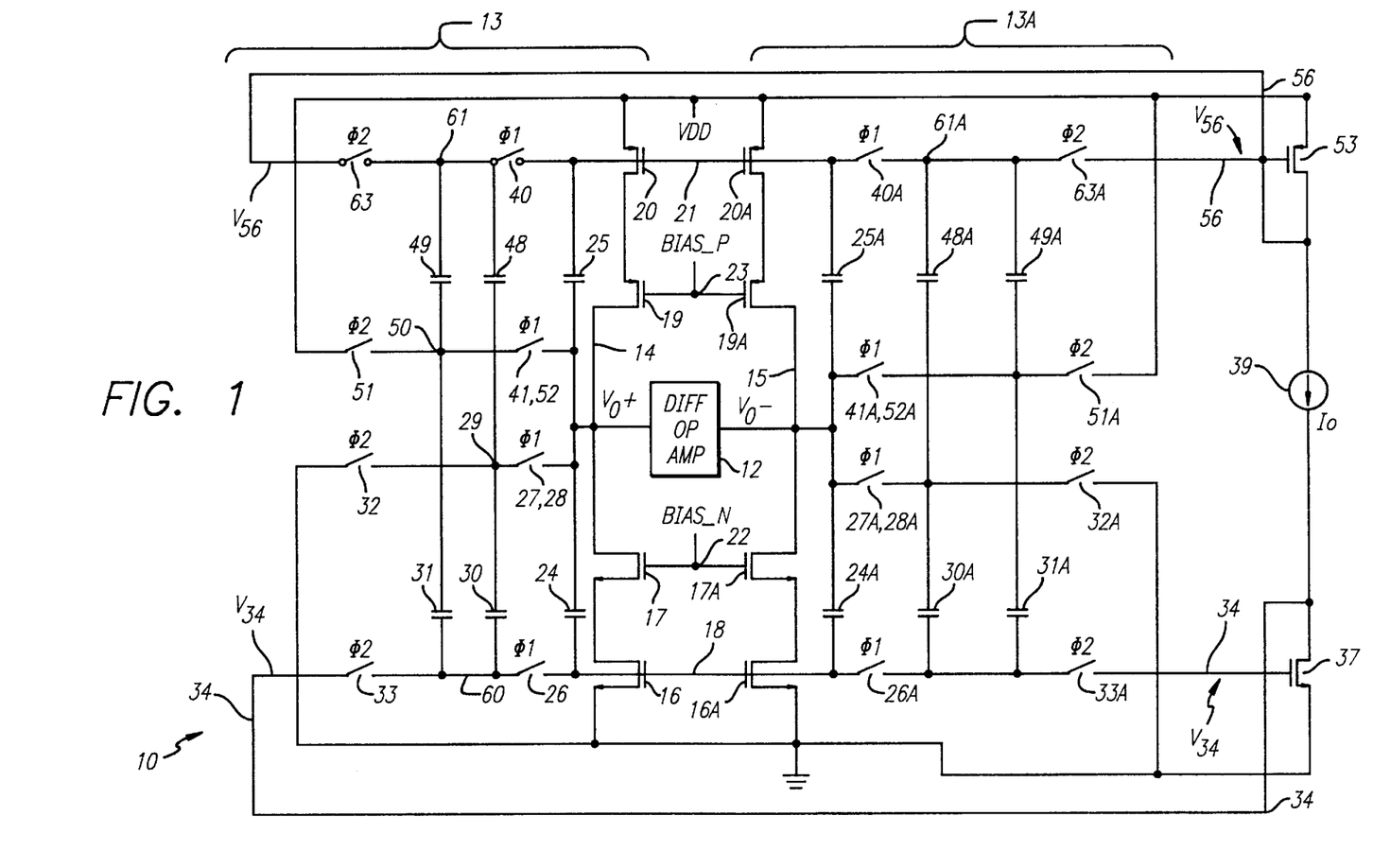
FIG. 1 is a simplified schematic diagram showing the CMFB circuit of the present invention.

Referring to FIG. 1, numeral 10 designates the combination of a differential operational amplifier 12 and the CMFB circuitry 13,13A which generates a stable common mode output voltage and imposes it on the outputs of differential operational amplifier 12. Note that FIG. 1 is a schematic diagram of the same circuit shown in more detail in FIG. 2. The same reference numerals are been used in both FIG. 1 and FIG. 2 to identify corresponding components. Differential operational amplifier 12 has a "positive" output $V_o^+$ and a "negative" output $V_o^-$ which are connected to terminals 14 and 15, respectively of the CMFB circuit that includes everything other than differential operational amplifier 12 and a bias circuit. The bias circuit includes a constant current source 39 connected between the drains of diode-connected P-channel MOSFET 53 and diode-connected N-channel MOSFET 37. The source of MOSFET 53 is connected to $V_{DD}$, and the source of MOSFET 37 is connected to ground. The bias circuit establishes an upper bias voltage $V_{56}$ on conductor 56, which is connected to the gate and drain of MOSFET 53, and also establishes a lower bias voltage $V_{34}$ on conductor 34, which is connected to the gate and drain of MOSFET 37.

Referring more particularly to FIG. 1, switch 63, controlled by a "sample" clock $\phi2$, is connected between conductor 56 and conductor 61, and switch 33, controlled by $\phi2$, is connected between conductor 34 and conductor 60. Capacitor 49 is connected between conductor 61 and conductor 50. Conductor 50 is connected by switch 51, controlled by $\phi2$, to $V_{DD}$. Capacitor 31 is connected between conductor 50 and conductor 60. Capacitor 48 is connected between conductor 61 and conductor 29. Switch 32, controlled by $\phi2$, is connected between ground and conductor 29. Capacitor 30 is connected between conductor 29 and conductor Switch 40, controlled by clock $\phi1$, is connected between conductor 61 and conductor 21. Conductor 21 is connected to the gate electrodes of P-channel MOSFETs 20 and 20A, the sources of which are connected to $V_{DD}$. The drains of MOSFETs 20 and 20A are connected to the sources of P-channel cascode MOSFETs 19 and 19A, respectively. The gates of cascode MOSFETs 19 and 19A receive a suitable bias voltage on conductor 23. Their drains are connected to conductors 14 and 15, respectively. Capacitor 25 is connected between conductor 21 and conductor 14.

Switch 26, controlled by $\phi1$, is connected between conductor 60 and conductor 18. Conductor 18 is connected to the gate electrodes of N-channel MOSFETs 16 and 16A, the sources of which are connected to ground. The drains of MOSFETs 16 and 16A are connected to the sources of N-channel cascode MOSFETs 17 and 17A, respectively. The gates of MOSFETs 17 and 17A receive a suitable bias voltage on conductor 22. The drains of MOSFETs 17 and 17A are connected to conductors 14 and 15, respectively. The output terminals $V_o^+$ and $V_o^{31}$ operational amplifier 12 are connected to conductors 14 and 15, respectively. Capacitor 24 is connected between conductors 14 and 18.

A switch 41/52 controlled by $\phi1$, is connected between conductor 50 and conductor 14, and a switch 27/28, also controlled by $\phi1$ is connected between conductors 29 and 14.

Note that the portion 13A of the CMFB circuit of FIG. 1 to the right of operational amplifier 12 is essentially identical to the portion 13 of the CMFB circuit to the left of differential operational amplifier 12. Accordingly, the reference numerals for portion 13A of the CMFB circuit are identical to those for portion 113, with the suffix "A" added.

The operation of the CMFB circuit as shown in FIG. 1 will be described next. Referring to portion 13 of the CMFB circuit, during the φ2 "sample" portion of circuit operation, switches 63, 51, 32, and 33 are closed and switches 40 and 41/52, and 27/28 and 26 are open. That is, the φ2-controlled switches are closed and the φ1-controlled switches are open.

Therefore, during φ2 the upper plates or terminals of capacitors 48 and 49 are charged to the upper bias voltage $V_{56}$. Capacitor 49 has its lower plate or terminal at $V_{DD}$ and capacitor 48 has its lower plate at ground. Note that bias circuit 37,39,53 is designed so that $V_{56}$ is equal to the desired bias voltage on conductor 21 and so that $V_{34}$ is the bias voltage desired on conductor 18 to set the proper quiescent current through the operating point MOSFETs 16, 16A, 20 and 20A.

During φ2 the upper plate of capacitor 30 is discharged to ground, and its lower plate is charged to the lower bias voltage $V_{34}$. The upper plate of capacitor 31 is charged to $V_{DD}$, and its lower plate is charged to $V_{34}$. Capacitors 30, 31, 48, and 49 are all equal in value, for example, 0.75 picofarads. Capacitors 24 and 25 are also equal, for example 2.5 picofarads.

The φ2-controlled switches 63, 51, 32, and 33 then are opened. Then, the φ1-controlled switches 40, 41/52, 27/28, and 26 are closed. The closing of switches 41/52 and 27/28 causes a redistribution of the charge on capacitors 48 and 49, which are thereby connected in parallel to establish a voltage across them, equal to $V_{56}$ minus $V_{DD}/2$. The closing of switches 40 and 40A redistributes the charge onto capacitors 25 and 25A.

The closing of switches 41,52 and 27,28 also causes a redistribution of the charge on capacitors 30 and 31, which are thereby connected in parallel to establish a voltage across them equal to $V_{DD}/2$ minus $V_{34}$. The closing of switches 26 and 26A redistributes the charge onto capacitors 24 and 24A.

Therefore, the voltage on conductor 21 approaches $V_{56}$ and the voltage on conductor 18 approaches $V_{34}$. This sets the common mode voltage of output conductors 14 and 15 to $V_{DD}/2$, and sets the quiescent current of the operating point control transistors to be equal to $I_o$. Note that if an input is applied to differential operational amplifier 12, it produces equal excursions above and below the common mode feedback voltage on conductors 14 and 15.

Unlike the prior art, in the circuit of FIG. 1 the voltages on conductors 18 and 21 are not established relative to any fixed reference voltage. Instead, the gates of N-channel MOSFETs 16 and 16A are dynamically refreshed to establish the voltages thereon.

Figure 5:
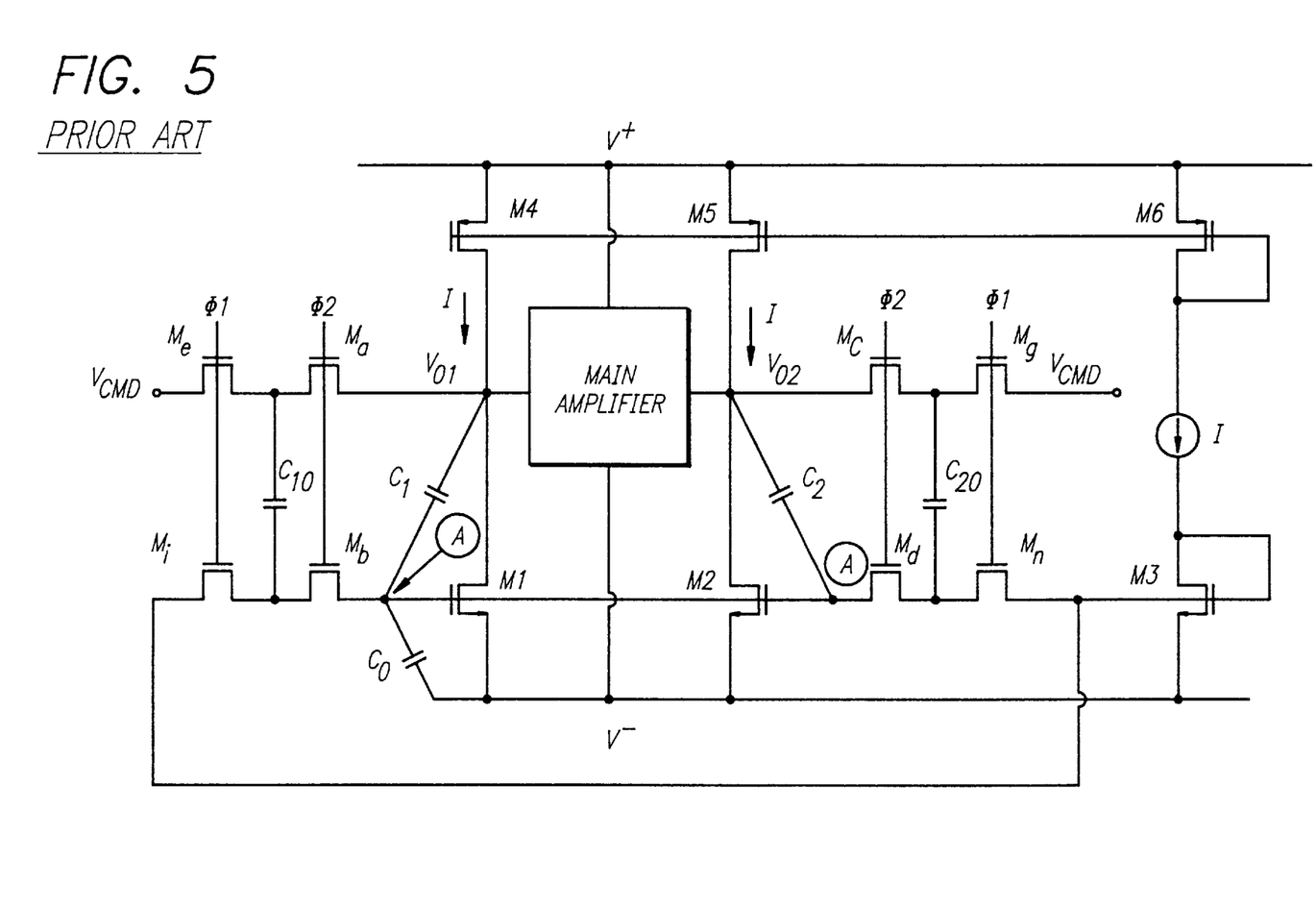
FIG. 5 is a schematic diagram useful in describing the prior art.

A negative-going transition or glitch of the common mode voltage of operational amplifier 12 will tend to turn off MOSFETs 16 and 17, because of the cooperation of capacitors 24 and 24A. Capacitors 25 and 25A will "pull" the gates of MOSFETs 20 and 20A to lower voltages, turning them both on harder in proportion to the magnitude of the negative-going transition or glitch, and thereby opposing it. Similarly, for a positive-going glitch, MOSFETs 20 and 20A will supply much more current opposing the glitch or transient than transistors M4 and M5 of the Costello and Gray circuit, without using the reference voltage circuit producing VCM as in the '943 patent, and providing a simple common mode feedback scheme that provides a common mode output voltage that is the midway between $V_{DD}$ and ground even when the $V_{DD}$ and ground voltages vary.

Figure 2:
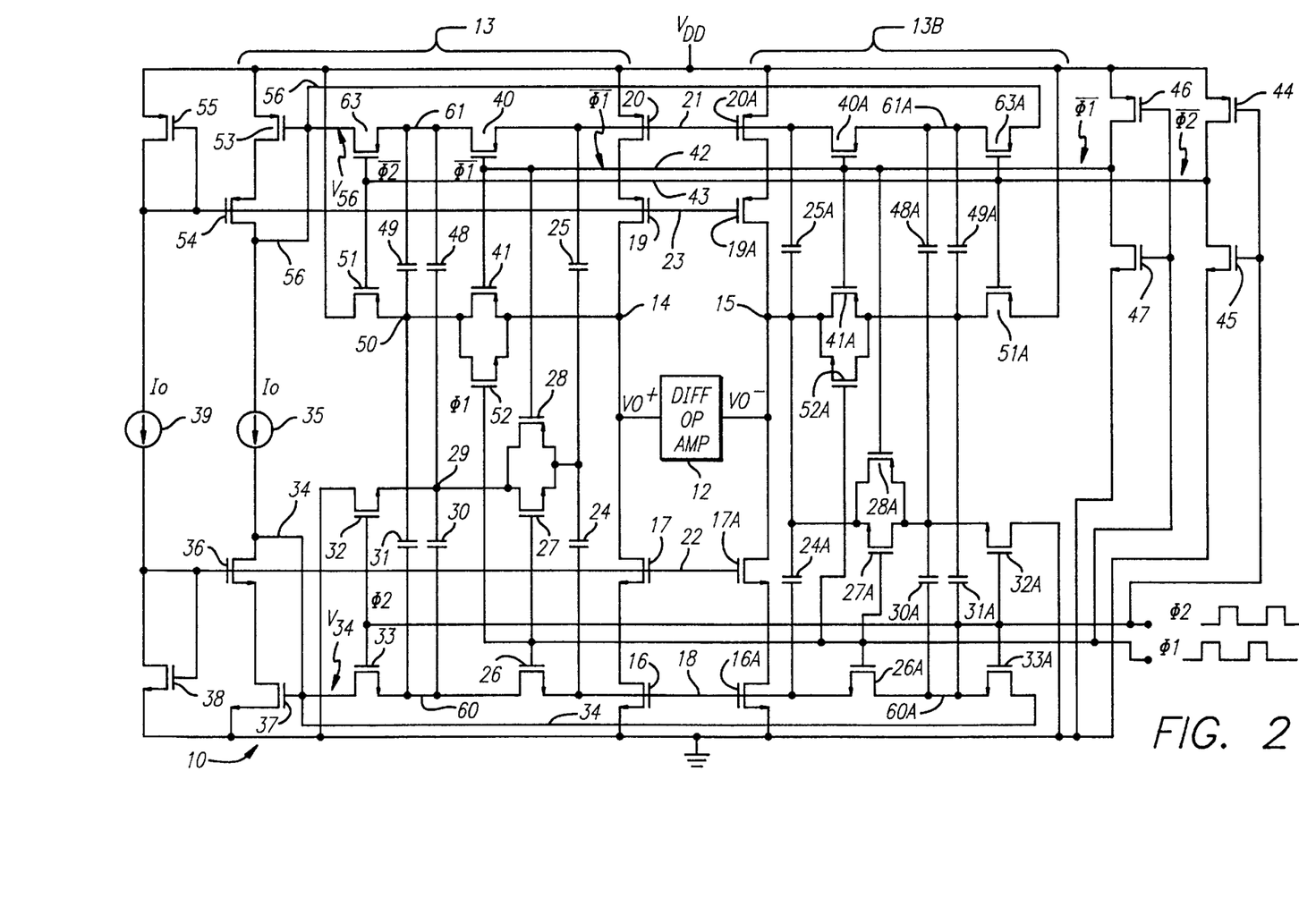
FIG. 2 is a detailed schematic diagram of the CMFB circuit of FIG. 1.

Referring now to FIG. 2, numeral 13 discloses the same circuit as FIG. 1, but including a somewhat more detailed schematic diagram of the CMFB circuitry 13,13A. As in FIG. 1, the circuitry 13A is essentially a mirror image of the circuitry 13, so corresponding reference numerals further including the letter "A" are used to designate corresponding elements in sections 13 and 13A of the CMFB circuit. N-channel MOSFETS 16, 17 and P-channel MOSFETs 19 and 20 are connected in series between $V_{DD}$ and ground. The drain electrodes of cascode MOSFETs 17 and 19 are joined at conductor 14 to the "+" output of differential operational amplifier 12. The gate electrode of MOSFET 16 and the gate electrode of its corresponding mirror image MOSFET 16A are connected by conductor 18 to the lower plate of capacitor 24 and the source of N-channel MOSFET 26. The gate of MOSFET 26 is connected to receive a clock signal φ1. φ1 and φ2 are simply non-overlapping clock pulses. The gates of cascode MOSFET 17 and its mirror image MOSFET 17A are connected by conductor 22 to a bias circuit including N-channel MOSFETs 36, 37, and 38.

The upper plate of capacitor 24 is connected by conductor 14 to the source electrodes of N-channel MOSFETs 27 and 28, the drains of which are connected to conductor 29. The gate electrode of MOSFET 27 receives clock signal 01. The gate electrode of MOSFET 28 is connected by conductor 42 to receive inverted clock signal $\overline{\phi 1}$ on conductor 42. $\overline{\phi 1}$ is generated by a CMOS inverter including P-channel MOSFET 46 and N-channel MOSFET 47 which are connected in series between $V_{DD}$ and ground, with their gate conductors connected to receive $\overline{\phi 1}$.

Conductor 14 also is connected to the source electrodes of P-channel MOSFETs 41 and 52, which have their drains connected to conductor 50 and their gate electrodes connected to $\overline{\phi 1}$ and φ1, respectively. Conductor 14 also is connected to the lower plate of capacitor 25, the upper plate of which is connected to conductor 21. Conductor 21 is connected to the gate electrode of P-channel MOSFET 20 and to the gate electrode of its mirror image P-channel MOSFET 20A. The gate electrode of P-channel cascode MOSFET 19 is connected by conductor 23 to the gate of its mirror image P-channel cascode MOSFET 19A and to a bias circuit including P-channel MOSFETs 53, 54, and 55.

P-channel MOSFET 55 has its gate and drain connected to one terminal of a constant current source 39, either terminal of which is connected to the gate and drain of N-channel MOSFET 38, the source of which is connected to ground. The source of MOSFET 55 is connected to $V_{DD}$. The drain of P-channel MOSFET 54 is connected by conductor 56 to one terminal of constant current source 35, the other terminal of which is connected by conductor 34 to the drain of N-channel MOSFET 36. The gate of MOSFET 36 is connected to the gate and drain of MOSFET 38 by conductor 22. The source of MOSFET 36 is connected to the drain of MOSFET 37, the source of which is connected to ground. The gate of MOSFET 37 is connected to conductor 34. The gate of MOSFET 54 is connected by conductor 23 to the gate and drain of MOSFET 55. The source of MOSFET 54 is connected to the drain of MOSFET 53, the source of which is connected to $V_{DD}$. The gate of MOSFET 53 is connected to conductor 56.

The drain electrodes of N-channel MOSFETs 27 and 28 are connected by conductor 29 to the upper plate of capacitor 30, the lower plate of which is connected to conductor 60. Conductor 29 also is connected to the lower plate of capacitor 48, the upper plate of which is connected by conductor 61 to the drain of P-channel MOSFET 40, the source of which is connected to conductor 21. The gate of MOSFET 40 is connected to receive $\overline{\phi 1}$. The lower plate of capacitor 30 is connected to the drain of N-channel MOSFET 26 and to the source of N-channel MOSFET 33. The gate of MOSFET 33 is connected to receive φ2 and to the gate of N-channel MOSFET 32. The source of MOSFET 32 is connected to conductor 29, and the drain thereof is connected to ground. The drain of MOSFET 33 is connected to conductor 34.

The drain electrodes of P-channel MOSFET 41 and N-channel MOSFET 52 are connected by conductor 50 to the source of P-channel MOSFET 51, the upper plate of capacitor 31, and the lower plate of capacitor 49. The lower plate of capacitor 31 is connected to conductor 60. The upper plate of capacitor 49 is connected to conductor 61. The gate electrode of P-channel MOSFET 51 is connected by conductor 43 to the gate electrode of P-channel MOSFET 52 so that both receive $\overline{\phi 2}$. The drain electrode of MOSFET 52 is connected to conductor 50. The drain electrode of MOSFET 51 is connected to $V_{DD}$.

The operation of the circuit 10 of FIG. 2 is essentially the same as that of FIG. 1, and therefore will not be repeated.

Figure 3:
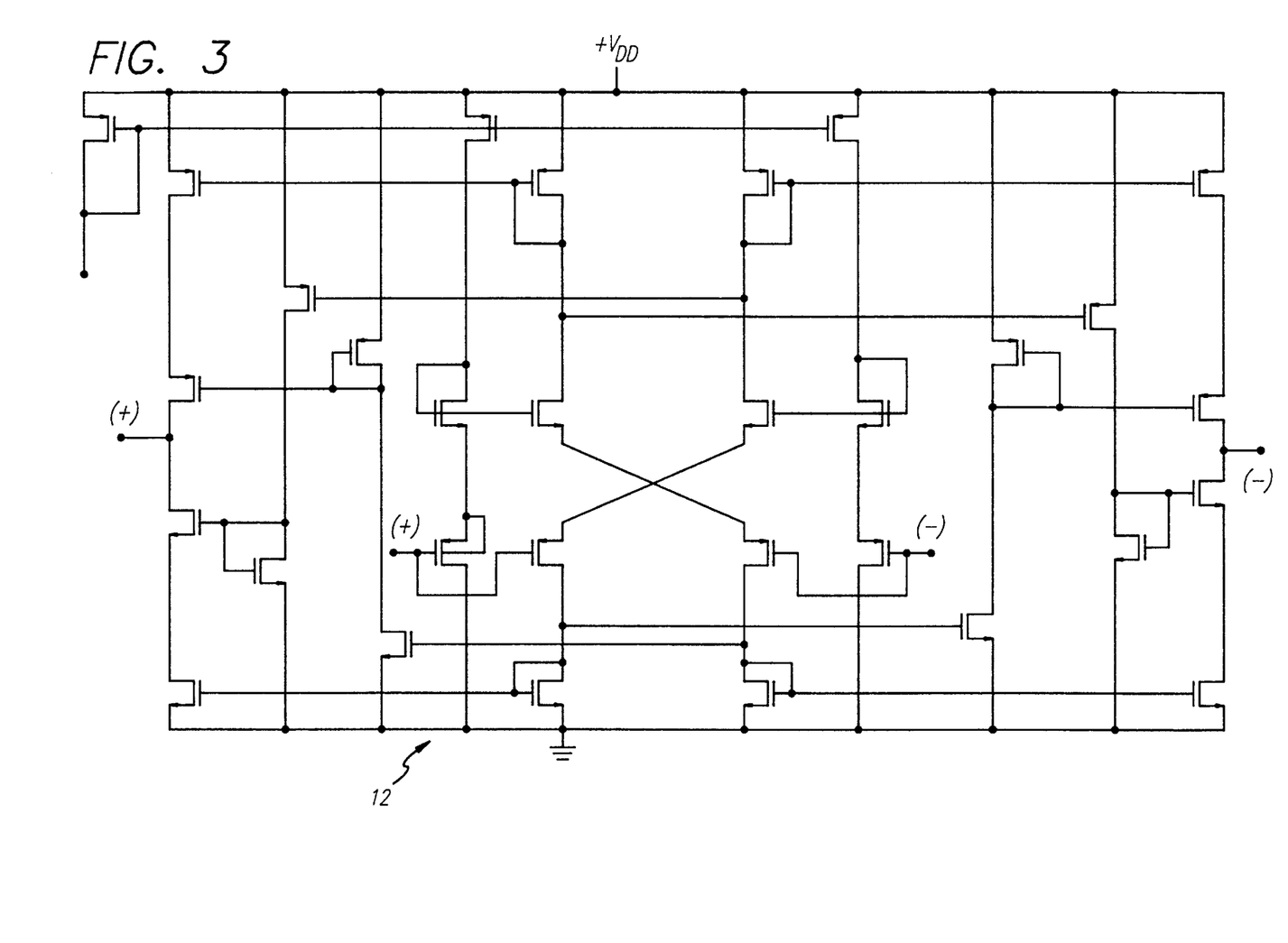
FIG. 3 is a detailed schematic diagram of the differential operational amplifier shown in block 12 of FIG. 2.

FIG. 3 is a schematic diagram of a particular implementation of differential operational amplifier 12. The details of this differential operational amplifier do not, standing alone, constitute a part of the invention, but are provided for completeness of disclosure.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the ratios of appropriate capacitors can be changed to provide a common mode output voltage which is anywhere between $V_{DD}$ and ground. Although the embodiment of FIGS. 1 and 2 utilizes four switch computer circuits each sampling $V_{DD}$ and ground and then redistributing the sampled charge onto a corresponding one of the four common mode feedback capacitors 24, 24A, 25 and 25A, respectively, fewer than four switch capacitor circuits could be used. For example, the two lower switched capacitor circuits including capacitors 30 and 31 and capacitors 30A and 31A could be used to "refresh" charge distribution capacitors 24 and 24A, respectively, during one sample/refresh cycle and then used to "refresh" charge distribution capacitors 25 and 25A, respectively, during the next sample/refresh cycle.

What is claimed is:

1. An operational amplifier circuit comprising in combination:
   (a) a differential operational amplifier having first and second outputs; and
   (b) a first common mode feedback circuit including
      i. first and second common mode voltage control terminals coupled to the first and second outputs, respectively;
      ii. a first operating point control transistor having a source coupled to a first supply voltage conductor conducting a first supply voltage and a drain coupled to the first common mode voltage control terminal, and a second operating point control transistor having a source coupled to a second supply voltage conductor conducting a second supply voltage and a drain coupled to the first common mode voltage control terminal;
      iii. a first common mode feedback capacitor having a first terminal coupled to a gate of the first operating point control transistor and a second terminal coupled to the first common mode voltage control terminal and a first terminal of a second common mode feedback capacitor having a second terminal coupled to a gate of the second operating point control transistor;
      iv. a first switched capacitor circuit including first and second sampling capacitors and first, second, third, and fourth switches interconnected to repeatedly sample a first reference voltage and the first and second supply voltages onto the first and second sampling capacitors and then redistribute resulting charges thereon onto the first common mode feedback capacitor; and
      v. a second switched capacitor circuit including third and fourth sampling capacitors and fifth, sixth, seventh, and eighth switches interconnected to repeatedly sample a second reference voltage and the first and second supply voltages onto the third and fourth sampling capacitors and then redistribute resulting charges thereon onto the second common mode feedback capacitor, the fourth switch being also included in the second switched capacitor circuit, and the seventh switch being also included in the first switched capacitor circuit, to thereby establish and maintain the first and second reference voltages on the gates of the first and second operating point transistors, respectively, to cause them to produce a common mode output voltage on the first output of the differential operational amplifier.

2. The operational amplifier of claim 1 including a second common mode feedback circuit substantially identical to the first producing a second common mode voltage equal to the first on the second output of the differential operational amplifier.

3. The operational amplifier circuit of claim 1 wherein the first operating point transistor is an N-channel MOSFET and the second operating point transistor is a P-channel MOSFET.

4. The operational amplifier circuit of claim 3 wherein the drain of the first operating point transistor is coupled to the first common mode voltage terminal by an N-channel cascode MOSFET, and the drain of the second operating point control transistor is coupled to the first common mode voltage terminal by a P-channel cascode MOSFET.

5. The operational amplifier circuit of claim 2 wherein the capacitances of the first, second, third, and fourth sampling capacitors and the first and second common mode feedback capacitors have values that cause the common mode output voltage to be midway between the first and second supply voltages.

6. The operational amplifier circuit of claim 1 wherein the first switched capacitor circuit includes a first switch controlled by a first clock signal coupled between the first common mode voltage control terminal and a first terminal of the first sampling capacitor, a second switch controlled by the first clock signal having one terminal coupled to the gate of the first operating point control transistor and a first terminal of the first common mode feedback capacitor and another terminal coupled to a second terminal of the first sampling capacitor, a third switch controlled by a second clock signal coupled between the first supply voltage and the first terminal of the first sampling capacitor, a fourth switch controlled by the second clock signal coupled between the first reference voltage and the second terminal of the first sampling capacitor, and a fifth switch controlled by the second clock signal coupled between a first terminal of the second sampling capacitor and the second supply voltage, a second terminal of the second sampling capacitor being coupled to the second terminal of the first sampling capacitor.

7. The operational amplifier circuit of claim 6 wherein the second switched capacitor circuit includes a sixth switch controlled by the first clock signal coupled between the first common mode voltage control terminal and a first terminal of the fourth sampling capacitor, a seventh switch controlled by the first clock signal having one terminal coupled to the gate of the second operating point control transistor and a first terminal of the second common mode feedback capacitor and another terminal coupled to a second terminal of the fourth sampling capacitor, the fifth switch, controlled by the second clock signal, coupled also to the first terminal of the fourth sampling capacitor, an eighth switch controlled by the second clock signal coupled between the second reference voltage and the second terminal of the fourth sampling capacitor, and the third switch, controlled by the second clock signal, being coupled between a first terminal of the third sampling capacitor and the first supply voltage, a second terminal of the third sampling capacitor being coupled to the second terminal of the fourth sampling capacitor.

8. An operational amplifier circuit comprising in combination:
   (a) a differential operational amplifier having first and second outputs; and
   (b) a common mode feedback circuit including
      i. first and second common mode voltage control terminals coupled to the first and second outputs, respectively;
      ii. a first operating point control transistor having a source coupled to a first supply voltage conductor conducting a first supply voltage and a drain coupled to the first common mode voltage control terminal, and a second operating point control transistor having a source coupled to a second supply voltage conductor conducting a second supply voltage and a drain coupled to the first common mode voltage control terminal;
      iii. a third operating point control transistor having a source coupled to a first supply voltage conductor conducting a first supply voltage and a drain coupled to the second common mode voltage control terminal, and a fourth operating point control transistor having a source coupled to a second supply voltage conductor conducting a second supply voltage and a drain coupled to the first common mode voltage control terminal;
      iv. a first common mode feedback capacitor having a first terminal coupled to a gate of the first operating point control transistor and a second terminal coupled to the first common mode voltage control terminal and a first terminal of a second common mode feedback capacitor having a second terminal coupled to a gate of the second operating point control transistor;
      v. a third common mode feedback capacitor having a first terminal coupled to the gates of the first and third operating point control transistors and a second terminal coupled to the second common mode voltage control terminal and a first terminal of a fourth common mode feedback capacitor having a second terminal coupled to the gates of the second and fourth operating point control transistors; and
      vi. a switched capacitor circuit including first and second sampling capacitors and first, second, third, fourth and fifth switches interconnected to sample a first reference voltage and the first and second supply voltages onto the first and second sampling capacitors and then redistribute resulting charges thereon onto at least one of the first, second common mode feedback capacitors, and then sample a second reference voltage and the first and second supply voltages onto the first and second sampling capacitors and then redistribute resulting charges thereon onto at least one of the third and fourth common mode feedback capacitors,
so as to establish and maintain the first reference voltage on the gates of the first and third operating point transistors, respectively, to cause them to produce a common mode output voltage on the first output of the differential operational amplifier, and to also establish and maintain the second reference voltage on the gates of the second and fourth operating point transistors, respectively, to cause them to produce the common mode output voltage on the second output of the differential operational amplifier.

9. A method of generating a common mode output voltage on first and second outputs of a differential operational amplifier by using a common mode feedback circuit including
   i. first and second common mode voltage control terminals coupled to the first and second outputs, respectively,
   ii. a first operating point control transistor having a source coupled to a first supply voltage conductor conducting a first supply voltage and a drain coupled to the first common mode voltage control terminal, and a second operating point control transistor having a source coupled to a second supply voltage conductor conducting a second supply voltage and a drain coupled to the first common mode voltage control terminal,
   iii. a third operating point control transistor having a source coupled to a first supply voltage conductor conducting a first supply voltage and a drain coupled to the second common mode voltage control terminal, and a fourth operating point control transistor having a source coupled to a second supply voltage conductor conducting a second supply voltage and a drain coupled to the first common mode voltage control terminal,
   iv. a first common mode feedback capacitor having a first terminal coupled to a gate of the first operating point control transistor and a second terminal coupled to the first common mode voltage control terminal and a first terminal of a second common mode feedback capacitor having a second terminal coupled to a gate of the second operating point control transistor, and
   v. a third common mode feedback capacitor having a first terminal coupled to the gates of the first and third operating point control transistors and a second terminal coupled to the second common mode voltage control terminal and a first terminal of a fourth common mode feedback capacitor having a second terminal coupled to the gates of the second and fourth operating point control transistors,
the method comprising the steps of:
   (a) providing a switched capacitor circuit including first and second sampling capacitors and first, second, third, fourth and fifth switches interconnected to sample first and second reference voltages and first and second supply voltages;
   (b) operating the switched capacitor circuit to sample the first reference voltage and the first and second supply voltages onto the first and second sampling capacitors and then redistribute resulting charges thereon onto at least one of the first and second common mode feedback capacitors; and (c) operating the switched capacitor circuit to sample a second reference voltage and the first and second supply voltages onto the first and second sampling capacitors and then redistribute resulting charges thereon onto at least one of the third and fourth common mode feedback capacitors, so as to establish and maintain the first reference voltage on the gates of the first and third operating point transistors, respectively, to cause them to produce a common mode output voltage on the first output of the differential operational amplifier, and to also establish and maintain the second reference voltage on the gates of the second and fourth operating point transistors, respectively, to cause them to produce the common mode output voltage on the second output of the differential operational amplifier.

* * * * *